US009578265B2

(12) United States Patent
Roffet et al.

(10) Patent No.: US 9,578,265 B2
(45) Date of Patent: Feb. 21, 2017

(54) DOUBLE CHARGE STORAGE AREA IMAGE CAPTURE DEVICE PIXEL STRUCTURE

(71) Applicant: STMICROELECTRONICS (GRENOBLE 2) SAS, Grenoble (FR)

(72) Inventors: Grégory Roffet, Coublevie (FR); Cédric Tubert, Saint-Egreve (FR)

(73) Assignee: STMICROELECTRONICS (GRENOBLE 2) SAS, Grenoble (FR)

( * ) Notice: Subject to any disclaimer, the term of this patent is extended or adjusted under 35 U.S.C. 154(b) by 0 days.

(21) Appl. No.: 14/956,576

(22) Filed: Dec. 2, 2015

(65) Prior Publication Data

US 2016/0366350 A1    Dec. 15, 2016

(30) Foreign Application Priority Data

Jun. 11, 2015    (FR) ...................................... 15 55336

(51) Int. Cl.
*H04N 5/359* (2011.01)
*H04N 5/355* (2011.01)
*H01L 27/146* (2006.01)

(52) U.S. Cl.
CPC ...... *H04N 5/3597* (2013.01); *H01L 27/14612* (2013.01); *H01L 27/14643* (2013.01); *H04N 5/3559* (2013.01)

(58) Field of Classification Search
None
See application file for complete search history.

(56) References Cited

U.S. PATENT DOCUMENTS

| 8,089,036 | B2* | 1/2012 | Manabe | H04N 5/353 250/208.1 |
|---|---|---|---|---|
| 2005/0157194 | A1* | 7/2005 | Altice, Jr. | H04N 3/155 348/308 |
| 2008/0018763 | A1* | 1/2008 | Sato | H04N 5/335 348/308 |
| 2008/0055441 | A1* | 3/2008 | Altice | H04N 5/35527 348/297 |

(Continued)

FOREIGN PATENT DOCUMENTS

| CN | 104702825 | 6/2015 |
| WO | 2008057527 | 5/2008 |

*Primary Examiner* — Timothy J Henn
(74) *Attorney, Agent, or Firm* — Allen, Dyer, Doppelt, Milbrath & Gilchrist, P.A.

(57) ABSTRACT

A method of acquisition of an image may include accumulating electrical charges by a photosensitive element of a pixel circuit of an image sensor during a first period, transferring the electrical charges accumulated during the first period to a first electrical charge storage region of the pixel circuit, and at the end of the transfer of the electrical charges, accumulating the electrical charges by the photosensitive element during a second period. The method may further include transferring the electrical charges accumulated during the second period to a second electrical charge storage region of the pixel circuit, successively transferring the electrical charges stored in the first and second storage regions to a common reading node of the pixel circuit, acquiring two images from electrical charges transferred to the reading node from the first and second storage regions, respectively, and combining the two images acquired into a resultant image.

18 Claims, 4 Drawing Sheets

(56) References Cited

U.S. PATENT DOCUMENTS

| | | | |
|---|---|---|---|
| 2008/0106625 A1* | 5/2008 | Border | H04N 5/35572 |
| | | | 348/296 |
| 2009/0251582 A1* | 10/2009 | Oike | H01L 27/14609 |
| | | | 348/308 |
| 2013/0135486 A1* | 5/2013 | Wan | H04N 5/765 |
| | | | 348/207.99 |
| 2014/0252201 A1* | 9/2014 | Li | H01L 27/14616 |
| | | | 250/208.1 |
| 2014/0346572 A1* | 11/2014 | Chen | H01L 27/14806 |
| | | | 257/229 |
| 2015/0163437 A1 | 6/2015 | Nishizawa | |
| 2016/0155768 A1* | 6/2016 | Yi | H01L 27/14643 |
| | | | 250/208.1 |

* cited by examiner

DOUBLE CHARGE STORAGE AREA IMAGE CAPTURE DEVICE PIXEL STRUCTURE

FIELD OF THE INVENTION

The present disclosure relates to CMOS technology matrix image sensors.

BACKGROUND

A CMOS type image sensor generally includes pixels or photosites disposed in a matrix configuration. Each pixel includes a photosensitive area, generally a photodiode, configured to accumulate electrical charges as a function of the light that it receives, and a reading circuit for measuring the quantity of charge accumulated by the photodiode. The reading circuit includes a transfer transistor for controlling the transfer of the electrical charges accumulated in the photodiode to a reading node to which a reading transistor is connected. The pixel is therefore controlled in accordance with a cycle including an integration phase, a reading phase and a reset phase. During the integration phase, the photodiode accumulates electrical charges as a function of the light that it receives. The reading phase includes generating a signal corresponding to the quantity of electrical charges accumulated by the photodiode during the integration phase. The reset phase includes eliminating the electrical charges accumulated by the photodiode during the integration phase.

Two shutter modes are used in image sensors, namely a global shutter mode and a rolling shutter mode. In the global shutter mode, all the pixels of the sensor are addressed at the same time and therefore in the same integration, reading or reset phase. In the rolling shutter mode, only two rows of pixels of the image sensor are in the integration phase and the reading phase, respectively. By comparison with the rolling shutter mode, the global shutter mode therefore offers the advantage of supplying a more accurate image, the exposure time and the content of which are uniform.

The embodiments set forth herein are related to image sensors using the global shutter mode.

Imaging devices (still cameras, video cameras) generally have a dynamic range much lower than that generally encountered in the real world, as perceived by the human eye. The dynamic range may be defined as the ratio between the maximum luminous intensity of an image (in the lightest or most illuminated area of the image) and the minimum intensity of the image (in the darkest area of the image). To increase the dynamic range of the images obtained, a high dynamic range (HDR) mode has been proposed that includes capturing a plurality of successive images, with different exposure (or integration) times. A first image obtained with a long integration time makes it possible to acquire details relating to dark areas of a scene and a second image obtained with a shorter integration time makes it possible to acquire details relating to light areas of the scene. These two images are then combined into a composite image including details both of the light areas and the dark areas.

Two successive images may be obtained using the pixel circuit PX shown in FIG. 1. The pixel circuit PX includes a photosensitive element EP such as a photodiode, a transfer transistor TG for controlling the transfer of the charges accumulated by the photosensitive element EP to a reading node RN, and a reading circuit. The transfer transistor TG is turned on by a signal VG applied to its gate. The reading circuit includes a transistor T5, a read selection transistor T6 and a reset transistor TR. The gate of the transistor T5 is connected to the reading node RN. The reading selection transistor T6 is connected to a power supply VT via the transistor T5 and supplies a reading voltage VX when it is turned on by a signal RD applied to its gate. The reset transistor TR is connected between the reading node RN and a power source such as the source VT and is turned on by a reset signal RST applied to its gate to reset the reading node RN. The pixel circuit PX may also include a global reset transistor T1 connecting the photosensitive element EP to a voltage source VAB when it is turned on by a control signal VGAB. Before an image is captured, the transistor T1 resets the photosensitive element EP. Similarly, the transistor TR may reset the reading node RN outside reading phases.

To implement the HDR mode, the pixel circuit PX includes a transistor T2 between the transistor TG and the reading node RN and a charge storage region CS formed between the transistors TG and T2. The charge storage region CS is represented in FIG. 1 by a capacitor C1 connected between ground and the connection between the transistors TG and T2.

FIG. 2 is a timing diagram of an image capture by an image capture device employing the global shutter mode and the HDR mode. The image sensor includes a plurality of pixel circuits PX. At a time t0, the photosensitive elements EP and the reading nodes RN of the image sensor are reset by the transistors T1 and TR of each pixel circuit PX of the image sensor. As soon as the reset phase RS ends at the time t1, there begins a first integration phase EXP1 for acquisition of a first image. At the time t2 marking the end of the first integration phase EXP1, the charges accumulated by the photosensitive elements EP during the integration phase EXP1 are transferred to the storage regions CS by applying a pulse to the gates of the transistors TG of the pixel circuit PX. At the time t3 there begins a first phase RD1 of reading the pixel circuits PX. This reading phase is generally performed row of pixels by row of pixels by applying a pulse to the gates of the transistors T2 of the pixel circuits PX to transfer the electrical charges from the storage regions CS to the reading nodes RN of the pixel circuits PX. The transistors T5 and T6 of the pixel circuits PX then read the value of the pixels row by row of pixels. The reading phase RD1 terminates at a time t6.

To implement the HDR mode, a second integration phase EXP2 and a second reading phase RD2 are performed. The reading phase RD2 cannot be started until the first reading phase RD1 has ended, i.e., before the end time t6 of the first reading phase RD1. Charges also need to be transferred between the photosensitive elements EP and the storage regions CS before the second reading phase RD2, which cannot be done before the end of the first reading phase RD1. This charge transfer is therefore performed between the time t6 and a time t7. The second reading phase (of the same duration as the first reading phase RD1) may commence from the time t7 and ends at a time t8.

Assuming that the second integration phase EXP2 is performed between a time t5 and the time t6, a reset phase RS is performed before the integration phase EXP2, between a time t4 and the time t5. The duration of the reset phase RS and the integration phase EXP2 of the second image between the times t4 and t6 is generally less than the duration of the reading phase RD1 for the first image. As a result, the photons received by the photosensitive elements EP of the image sensor between the times t3 and t4 are not used to form an image. This absence of image capture between the times t3 and t4 may lead to the formation in the image of a fuzzy or duplicated object ("ghost" phantom effect) if this object is mobile in the scene captured by the image sensor.

It may therefore be desirable to improve the quality of an image obtained in a high dynamic range (HDR) mode, notably by reducing the effects of fuzziness or phantom effects when the scene to be capture includes moving objects.

SUMMARY

Embodiments concern a method of acquisition of an image using an image sensor. The method may include accumulating electrical charges by a photosensitive element of a pixel circuit of the image sensor during a first period, and transferring the electrical charges accumulated during the first period to a first electrical charge storage region of the pixel circuit. The method may further include, at the end of the transfer of the electrical charges, accumulating the electrical charges by the photosensitive element during a second period having a duration different from that of the first period, transferring the electrical charges accumulated during the second period to a second electrical charge storage region of the pixel circuit, and successively transferring the electrical charges stored in the first and second storage regions to a common reading node of the pixel circuit separate from the first and second storage regions. The method may also include acquiring two images from electrical charges transferred to the reading node from the first and second storage regions, respectively, and combining the two images acquired into a resultant image.

In accordance with one example embodiment, a first of the two acquired images may include details of the dark areas of a second of the two acquired images, which includes details of light areas of the first image.

Furthermore, the electrical charges accumulated during the first and second periods may be transferred successively from the photosensitive element of the pixel circuit to the second storage region of the pixel circuit, and then from the second storage region of the pixel circuit to the first storage region of the pixel circuit before they are transferred to the reading node of the pixel circuit.

In accordance with one embodiment, the electrical charges accumulated during the first period are transferred directly from the photosensitive element of the pixel circuit to the first storage region of the pixel circuit, and the electrical charges accumulated during the second period are transferred directly from the photosensitive element to the second storage region of the pixel circuit. The electrical charges stored in the first and second storage regions are alternately transferred directly to the reading node of the pixel circuit.

The two images may be acquired row of pixels by row of pixels by transferring to the reading node of each pixel circuit one of the rows of pixels, the charges stored in the first storage region, and then the charges stored in the second storage region.

In accordance with one embodiment, the acquisition of the two images may be triggered immediately at the end of the second period of accumulation of electrical charges.

Furthermore, the first period of accumulation of electrical charges may be triggered after the transfer for a previous image capture of electrical charges accumulated during the second period to the second electrical charge storage region of the pixel circuit. This may terminate after an interframe period beginning at the end of the image acquisition period of the preceding image capture.

In accordance with one embodiment, one of the first and second periods of accumulation of electrical charges may have a duration equal to that of the other of the first and second periods of accumulation of electrical charges multiplied by a power of 2.

Embodiments may also concern an image acquisition device including a pixel circuit. The pixel circuit may include a photosensitive element, first and second electrical charge storage regions, a reading node coupled to a reading circuit, and a first transistor gate coupled between the photosensitive element and the first storage region. A second transistor gate may be coupled between the second storage region and the reading node, and a reading circuit may be coupled to the reading node. The image acquisition device may include a control circuit configured to execute the method defined above.

In accordance with one embodiment, the device may include a third transistor gate coupled between the first and second storage regions. The first transistor gate may be coupled between the photosensitive element and the second storage region.

The device may also include a third transistor gate coupled between the photosensitive element and the second storage region, and a fourth transistor gate coupled between the second storage region and the reading mode. The first transistor gate may be coupled between the photosensitive element and the first storage region.

In accordance with an embodiment, each of the first and second storage regions may include an implantation of dopants forming a well in a semiconductor substrate in which the photosensitive element and the transistor gates and a screen covering the well are formed.

The reading circuit may include an amplifier transistor having a gate terminal connected to the reading node supplying a voltage representative of the electrical charges present at the reading node, and a selector transistor connected to the amplifier transistor and supplying the voltage representative of the electrical charges present at the reading node at an output of the pixel circuit when the pixel circuit is selected for reading.

BRIEF DESCRIPTION OF THE DRAWINGS

Embodiments are described hereinafter in a non-limiting manner and with reference to the appended figures, in which.

BRIEF DESCRIPTION OF THE DRAWINGS

Figure 3:
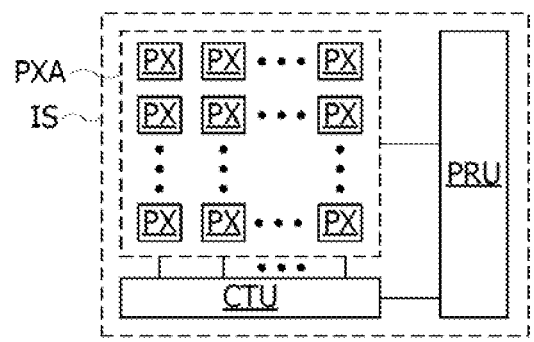
FIG. 3 is a schematic block diagram of a device including an image sensor in accordance with an example embodiment.

A shown a device IS in accordance with an example embodiment including an image capture function is shown in FIG. 3. The device IS may be an image sensor, a portable device such as a still camera, a video camera, a mobile telephone, or other device having an image capture function. The device IS may include a matrix PXA of pixel circuits PX. The matrix PXA includes pixel circuits PX disposed in rows and columns. The device IS also illustratively includes control circuits CTU configured to supply different control signals to the pixel circuits PX as a function of phases to be strung together to capture an image. The matrix PXA supplies an image signal to a processor unit PRU. The processor unit PRU may include a processor and memories for processing and storing the received image signal.

Figure 4:
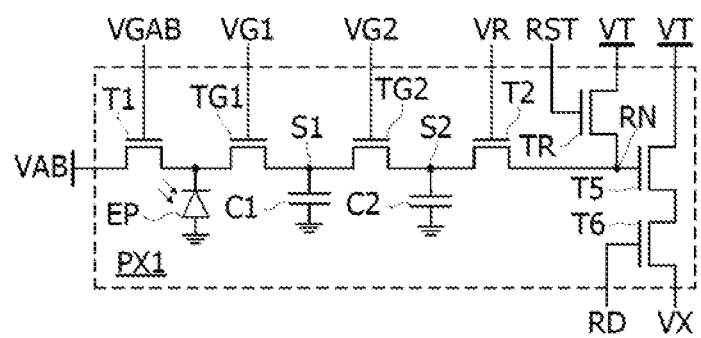
FIG. 4 is a schematic diagram of one embodiment of a pixel circuit for the image sensor of FIG. 3.

One embodiment of a pixel circuit PX1 is illustrated in FIG. 4, which may be one of the pixel circuits PX of the device IS from FIG. 3. The pixel circuit PX1 illustratively includes a photosensitive element EP, such as a photodiode, and transistors TG1, TG2 and T1, T2, TR, T5 and T6, for example N-channel MOS transistors. The photosensitive element EP has a first terminal connected to ground and a second terminal connected to a source of a power supply voltage VAB via the transistor T1, and to an electrical charge storage area S1 via the transfer transistor TG1. The storage area S2 is represented in FIG. 4 by a capacitor C1 connected between a conduction terminal of the transistor TG1 and ground. The transistors T1 and TG1 are controlled by signals VGAB and VG1, respectively. The pixel circuit PX1 includes a reading node RN connected to the storage area S1 via the transistor T2. The transistor T2 is controlled by a signal VR to transfer charges to the reading node RN.

The reading node RN is also connected to the gate of the source follower transistor T5, which is connected to a source of a power supply voltage VT via the transistor TR. The transistor T5 is connected between the reading transistor T6 and a power supply voltage source that can be the voltage VT. The transistor T6 is controlled by a signal RD to supply a reading signal VX representative of the quantity of electrical charge accumulated by the photosensitive element EP and transferred to the reading node RN. Thus, the transistor T5 supplies the signal VX, and the transistor T6 supplies the voltage VX at the output of the pixel circuit PX1 when the latter is selected in read mode by the signal RD. The transistor TR is controlled by a signal RST to reset the reading node RN.

In accordance with one embodiment, the pixel circuit PX1 includes another transfer transistor TG2 and another storage region S2 disposed between the storage area S1 and the transistor T2. The storage area S2 is represented in FIG. 4 by a capacitor S2 connected between ground and the connection between the transistors TG2 and T2. Thus, the storage regions S1, S2 are connected in series, the charges stored in the region S1 being transferred into the region S2 when the transistor TG2 is turned on.

Figure 5:
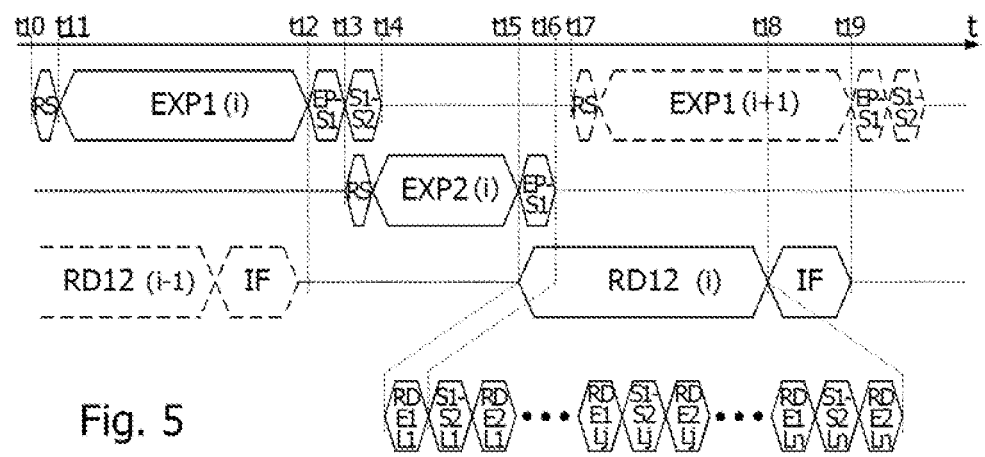
FIG. 5 is a timing diagram of different control phases of one embodiment of an image sensor including a plurality of pixel circuits shown in FIG. 4.

FIG. 5 provides a timing diagram of various control phases of an image sensor including a plurality of pixel circuits, such as the circuit PX1 from FIG. 4. In accordance with one embodiment, these various phases enable use of the global shutter and HDR modes. At a time t10, the photosensitive elements EP and the reading nodes RN of the image sensor are reset by the transistors T1 and TR of each pixel circuit PX1 of the image sensor. Immediately at the end of the reset phase RS at the time t11, a first integration phase EXP1 for acquiring a first image commences. Between a time t12 marking the end of the first integration phase EXP1 and a time t13, the charges accumulated by the photosensitive elements EP of the image sensor are transferred to the storage regions S1. This transfer is initiated by applying a pulse to the gates of the transistors TG1 of the pixel circuits PX1 of the image sensor. Between the time t13 and a time t14, the charges stored in the storage regions S1 are transferred into the storage regions S2 by applying a pulse to the gates of the transistors TG2 of the pixel circuits PX1.

At the time t13, after the transfer of the charges accumulated during the first integration phase EXP1, a second integration phase EXP2 may be activated to acquire a second image. The integration time EXP2 of the second image is different from the integration time EXP1 of the first image. For example, the integration time of the second image may be less than the integration time of the first image. For convenience, by way of example, the integration time of the first image may be equal to the integration time of the second image multiplied by a power of 2 ($2^n$), for example multiplied by 2, 4 or 8. The photosensitive elements EP of the image sensor are reset at the time t13 just before the second integration phase EXP2 that terminates at a time t15.

In accordance with one embodiment, the first and second images acquired during the integration periods EXP1, EXP2 are read during a reading phase RD12, alternately, row of pixels by row of pixels, starting from the time t15. The charges accumulated by the photosensitive elements EP during the integration phase EXP2 are transferred from the photosensitive elements EP to the storage regions S1 between the time t15 and a time t16. At the time t16 the electrical charges accumulated for the first image during the first integration period EXP1 are stored in the storage region S2, and the electrical charges accumulated for the second image during the second integration period EXP2 are stored in the storage region S1. During the transfer effected between the times t15 and t16, a first row of the first image acquired during the integration phase EXP1 may be read. To this end, the charges stored in the storage regions S2 of the pixel circuits PX1 of this row of pixels are transferred to the reading nodes RN.

The charges present in the regions S1 of this row of pixels are then transferred into the regions S2, before proceeding to read this row of pixels again to acquire the first row of pixels of the second image. This process of reading a row of the two images is repeated for each row j of pixels of the image sensor up to a last row n of pixels. This process therefore includes reading the row j of pixels of the image sensor to acquire the row j of the first image, a transfer of charges between the regions S1 and S2 to read the row j of the second image, and a reading of the row j of pixels of the image sensor to acquire the row j of the second image. Note that the rows of pixels of the image sensor are not necessarily read consecutively, as a form of interleaving of rows can be used. For example, reading the odd rows, then the even rows of the image sensor may therefore be envisaged. Each row of pixels of the image sensor is read twice and consecutively to acquire that row in the first image and in the second image. During the integration phases EXP1, EXP2 and the reading phase RD12 the transistor TR of the pixel circuits PX1 controlled by the signal RST may remain turned on when the reading node is not being used to read a pixel signal.

The phases described above concern the acquisition of a shot (i). FIG. 5 also represents a reading phase for a shot (i−1) and a first integration phase for a first image of a shot (i+1). It should be noted that each reading phase RD12 is followed by a so-called "interframe" (IF) phase during which the storage regions S1, S2 and the reading nodes RN of the image sensor cannot be used. As a result of this the integration phase EXP1 does not terminate before the end of the interframe phase IF of the preceding shot. Furthermore, the integration phase EXP1 does not start before the charges accumulated during the second integration phase EXP2 of the preceding shot have been transferred from the photosensitive elements EP to the first storage regions S1, given the reset time RS of the photosensitive elements EP. In other words, the integration phase EXP1 of the shot (i+1) in FIG. 5 may commence at the earliest at the time t16, and terminate at the earliest at the time t19, marking the end of the interframe phase IF of the shot (i). The time t16 for starting resetting RS of the photosensitive elements, followed by the first integration phase EXP1, is therefore determined as a function of the time t15 of the start of the reading phase RD12 and the duration of that phase, which is constant, the determined duration of the first integration phase EXP1, and the duration of the interframe phase IF, which is also constant for a given image sensor. Note that the duration of the integration phase EXP1 may be less than the duration of the reading phase RD12 if the image sensor is strongly illuminated.

The two acquired images corresponding to the integration phases EXP1 and EXP2 are combined, for example, by the processor unit PRU to produce a single resultant image in which a first of the two acquired images corresponding to the longer integration phase supplies the details in dark areas of the second of the two acquired images. The second image corresponding to the shorter integration phase supplies the details of light areas of the first image.

Figure 1:
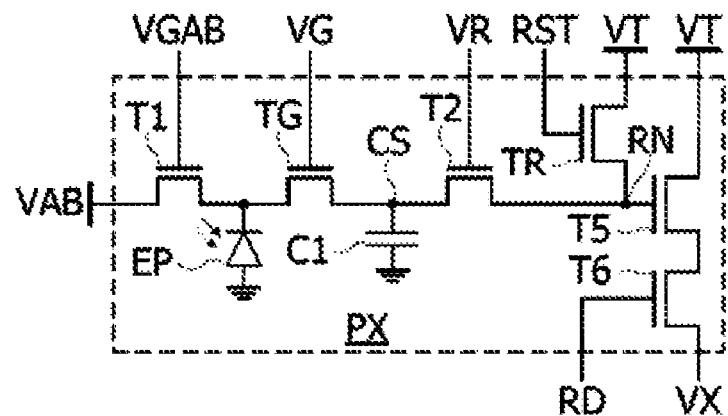
FIG. 1, described above, is a schematic diagram of a conventional pixel circuit.
Figure 2:
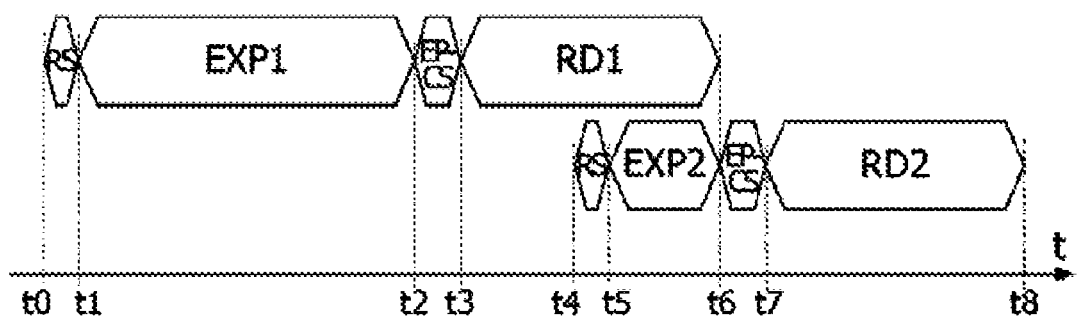
FIG. 2, described above, is a timing diagram illustrating different phases of controlling an image sensor including pixel circuits such as in FIG. 1.

The pixel circuit PX1 therefore makes it possible to eliminate the waiting time between the times t3 and t4 in FIG. 2. It may be noted that the reading node RN cannot be validly used as a storage region, given that it is subject to a high level of leakage because of the presence of the transistors TR and T5 connected to this node.

Figure 6:
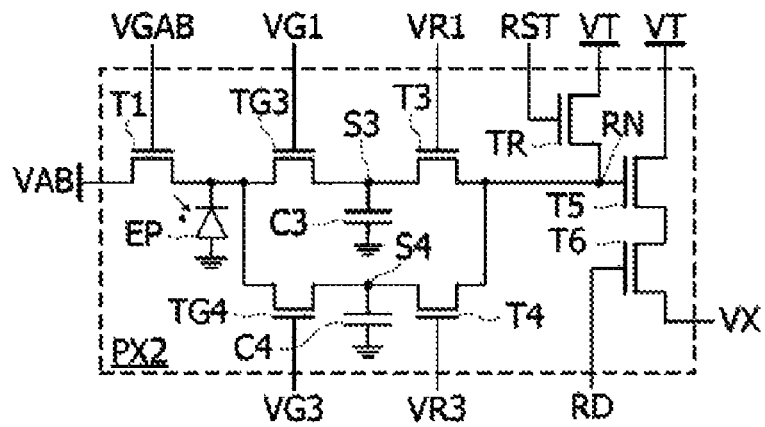
FIG. 6 is a schematic diagram of another example embodiment of a pixel circuit for the image sensor of FIG. 3.

One embodiment of a pixel circuit PX2 is illustrated in FIG. 6, in which pixel circuit PX2 may be one of the pixel circuits PX of the device IS from FIG. 3. The pixel circuit PX2 differs from the pixel circuit PX1 in that the charge storage regions are disposed not in series, but in parallel. Thus, the pixel circuit PX2 includes a photosensitive element EP such as a photodiode and transistors TG3, TG4, T1, T5, T6, TR3 and TR4. The photosensitive element EP has a first terminal connected to ground and a second terminal connected to a source of a power supply voltage VAB via the transistor T1, to a first electrical charge storage area S3 via the transfer transistor TG3, and to a second electrical charge storage area S4 via the transfer transistor TG4. The storage areas S3, S4 are represented in FIG. 6 by a capacitor C3 connected between ground and the connection between the transistors TG3 and T3 and between ground and the connection between the transistors TG4 and T4. The transistors T1, TG3, TG4 are controlled by signals VGAB, VG3 and VG4, respectively.

The pixel circuit PX2 includes a reading node RN connected to the storage region S3 via the transistor T3 and to the storage region S4 via the transistor T4. The transistors T3 and T4 are controlled by signals VR3, VR4, respectively, to transfer charges to the reading node RN. The reading node RN is also connected to the gate of the source follower transistor T5, and connected to a source of a power supply voltage VT via the transistor TR. The transistor T5 is connected between the reading transistor T6 and a source of a power supply voltage, such as the voltage VT. The transistor T6 is controlled by a signal RD to supply a reading signal VX representative of the quantity of electrical charges accumulated by the photosensitive element EP and transferred to the reading node RN. The transistor TR is controlled by a signal RST to reset the reading node RN.

Figure 7:
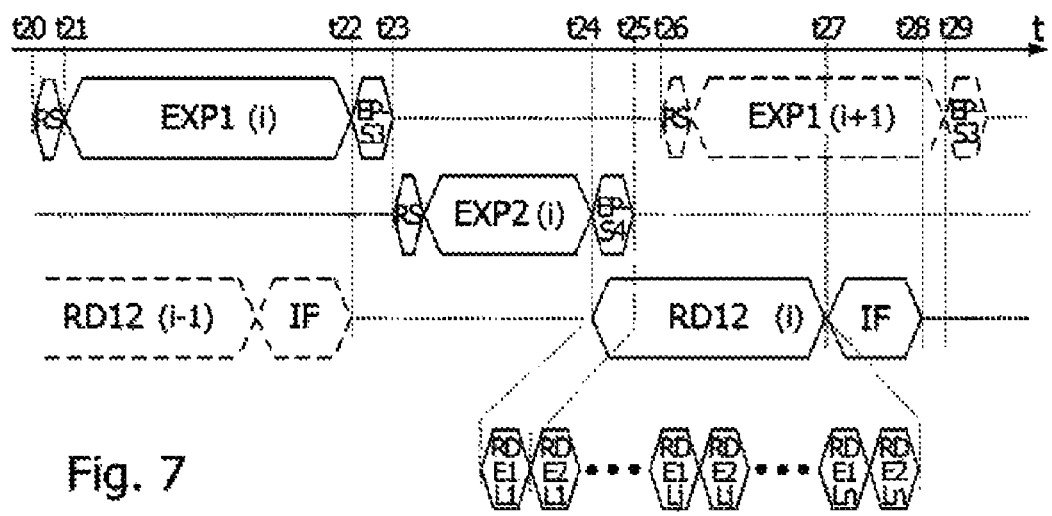
FIG. 7 is a timing diagram illustrating different control phases of one embodiment of an image sensor including a plurality of pixel circuits shown in FIG. 6.

FIG. 7 provides a timing diagram of various control phases of an image sensor including a plurality of pixel circuits, such as the circuit PX2 from FIG. 6. In accordance with one embodiment, these various phases enable use of the global shutter and HDR modes. At a time t20, the photosensitive elements EP and the reading nodes RN of the image sensor are reset by controlling the transistors T1 and TR of each pixel circuit PX2 of the image sensor. Immediately at the end of the reset phase RS at the time t21 there commences a first integration phase EXP1 for acquiring a first image. Between a time t22 marking the end of the first integration phase EXP1 and a time t23 the charges accumulated by the photosensitive elements EP of the image sensor are transferred into the storage regions S3 by applying a pulse to the gates of the transistors TG1 of the pixel circuits PX2. At the time t23, after the transfer of the charges accumulated during the first integration phase EXP1, a second integration phase EXP2 can be activated to acquire a second image. Here also, the integration time of the second image is different and may be less than the integration time of the first image. For example, the integration time of the first image may be equal to the integration time of the second image multiplied by a power of 2 ($2^n$), e.g., multiplied by 2, 4 or 8.

The photosensitive elements EP of the image sensor are reset at the time t23 just before the second integration phase EXP2 that terminates at a time t24. Between the time t24 and a time t25 the charges accumulated by the photosensitive elements EP during the second integration phase are transferred to the storage regions S4 by applying a pulse to the gates of the transistors TG4 of the pixel circuits PX2. Before the time t24, the electrical charges accumulated for each pixel of the first image during the first integration period EXP1 are therefore stored in the storage region S3, and at the time t25 the electrical charges accumulated for each pixel of the second image during the second integration period EXP2 are stored in the storage region S4.

The first and second images acquired during the integration periods EXP1, EXP2 and stored in the storage regions S3 and S4 are read during a reading phase RD12, alternately, row of pixels by row of pixels and starting from the time t24. During the transfer effected between the times t24 and t25, a first row of the first image acquired during the integration phase EXP1 may be read. To this end, the charges stored in the storage regions S1 of the pixel circuits PX1 of this row of pixels are transferred to the reading nodes RN to acquire the first row of pixels of the first image. Thereafter this row of pixels is read again to acquire the first row of pixels of the second image, the electrical charges being transferred from the storage region S4 to the reading node RN beforehand. This process of reading a row of the two images is repeated for each row j of the image sensor up to a last row n of pixels. This process therefore comprises reading the row j of pixels of the first image, followed by reading the row j of pixels of the second image. Here again, the rows of pixels of the two images are not necessarily read consecutively. It is simply important to read consecutively a row of the first image and a row of the same rank of the second image.

During the various integration phases EXP1, EXP2 and reading phases RD12, the transistor TR of the pixel circuits PX2 controlled by the signal RST may remain turned on if the reading node RN is not being used to read a pixel signal.

The phases described above concern the acquisition of a shot (i). FIG. 7 also illustrates a reading phase RD12 for a shot (i−1), and an integration phase EXP1 for a first image of a shot (i+1). Each reading phase RD12 is also followed by a so-called "interframe" (IF) phase during which the storage regions S3, S4 and the reading nodes RN of the image sensor cannot be used. As a result of this the integration phase EXP1 does not terminate (at the time t29) before the end of the interframe phase IF at a time t28 of the preceding shot (i). Furthermore, the integration phase EXP1 does not start before the charges accumulated during the second integration phase EXP2 of the preceding shot are transferred from the photosensitive elements EP to the second storage regions S4, given the time necessary for the resetting RS of the photosensitive elements EP. In other words, the integration phase EXP1 of the shot (i+1) in FIG. 7 may commence at the earliest at the time t25 and terminate at the earliest at the time t28 marking the end of the interframe phase IF of the shot (i). The time t26 of the start of resetting RS of the photosensitive elements followed by the first integration phase EXP1 is therefore determined as a function of the time t24 of the start of the reading phase RD12 and the duration of this phase, which is constant, the determined duration of the first integration phase EXP1, and the duration of the interframe phase IF, which is also constant for a given image sensor. Note that the duration of the integration phase EXP1 may be less than the duration of the reading phase D12 if the image sensor is strongly illuminated.

The pixel circuit PX2 therefore has the advantage over the pixel circuit PX1 of avoiding the transfers of electrical charges between two storage regions (S1 and S2). On the other hand, the circuit PX2 includes one more transistor (transistor T4) than the circuit PX1.

In FIGS. 5 and 7, the durations of the reset steps RS, the transfer steps EP-S1, S1-S2, EP-S3, and the steps of reading a row of pixels of the image sensor are of the order of a few microseconds. Moreover, the durations of the integration phases EXP1, EXP2 are greater than around one hundred microseconds and may reach several tens of milliseconds. The duration of the interframe period IF, which varies from one image sensor to another, is of the order of few tens of milliseconds.

Figure 8:
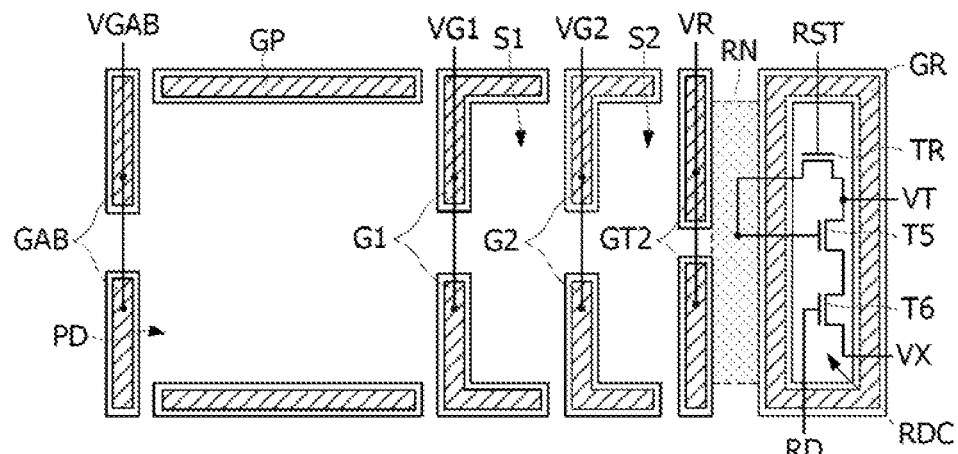
FIGS. 8 and 9 represent are plan views of a semiconductor substrate on which the pixel circuits from FIGS. 4 and 6, respectively, are implemented.
Figure 9:
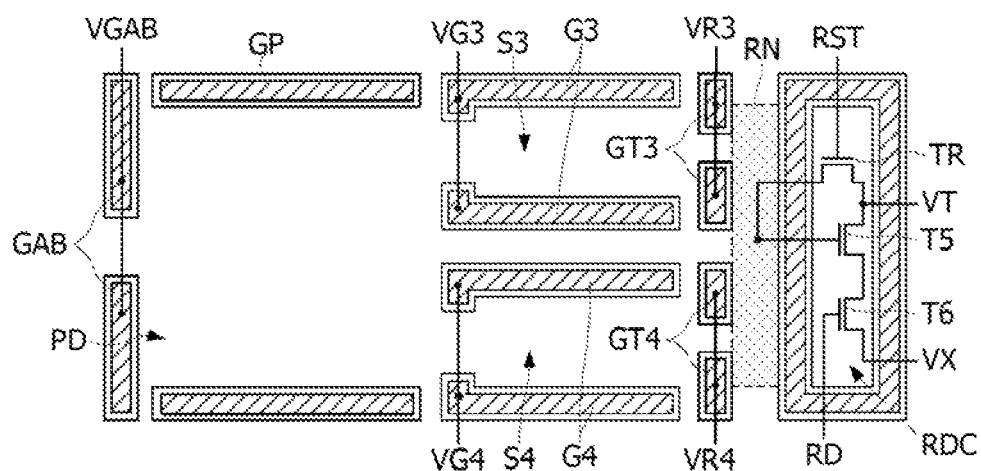
Figure 10:
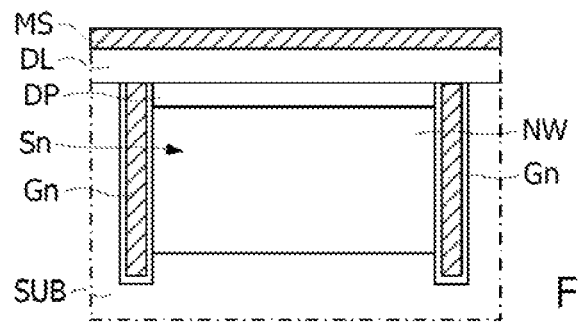
FIG. 10 is a sectional view of a substrate which may be used in the embodiments shown in FIG. 8 or 9.

In FIG. 8, an embodiment on a semiconductor substrate of the pixel circuit PX1 (FIG. 4) is shown. An embodiment on a semiconductor substrate of the pixel circuit PX2 (FIG. 6) is shown in FIG. 9. In FIG. 10, a sectional view of the photosensitive element or of a charge storage region from FIG. 8 or 9 is provided.

In FIGS. 8 and 9, the pixel circuit includes a photosensitive area PD forming the photosensitive element EP, the two charge storage regions S1, S2 or S3 and S4, and a reading area RN connected to a reading circuit RDC. In the example of FIGS. 8 to 10, the substrate SUB is weakly or lightly P-type doped (P-). The photosensitive region PD includes an N-type doped well NW, of doping level N1, forming with the substrate SUB the junction of a photodiode. The storage regions Sn (S1, S3, S4) include an N-type doped well NW of doping level N2 and the storage region S2 includes an N-type doped well of storage level N3. The regions PD and S1 to S4 may also include at the surface of the wells NW a shallow region DP that is strongly P-type doped. The wells NW of the regions PD and S1 to S4 form with the substrate SUB the junction of a depleted or pinch type diode in that the potential of the wells NW, in the absence of charges and illumination, is fixed by the dopant concentrations of the regions NW and DP. In the FIG. 10 example, the isolated vertical gates extend to a depth greater than that of the wells NW.

For example, the wells forming the regions PD, S1 to S4 may have the same depth, and approximately parallelepiped shape, and substantially the same electrically charge storage capacity. To help ensure complete transfers of charges from the photosensitive region PD to the storage region S1 or to the doping regions S3 and S4, with little risk of backward return, the doping level N1 of the photosensitive region PD is lower than the doping level N2 of the storage regions S1, S3 and S4. Likewise, to help ensure a complete transfer of charges from the storage region S1 to the storage region S2, with little risk of backward return, the doping level N2 of the region S1 is lower than the doping level N3 of the region S2. If the regions PD, S1 to S4 have substantially the same electrical charge storage capacity, the area of the substrate SUB occupied by the storage regions S1, S3 and S4 may be less than that occupied by the photosensitive region PD, and the area of the substrate occupied by the region S2 may be less than that occupied by the region S1.

Each of the regions PD, S1 to S4 and the reading circuit RDC are surrounded by trenches forming isolated vertical gates. Isolated vertical gates GP, GAB therefore isolate the photosensitive region PD from the rest of the substrate. The gate GAB that forms the gate of the transistor T1 separates the well of the photodiode PD from the rest of the substrate except in an area for charges to pass between the region PD and a doped area in the substrate forming a conduction region of the transistor T1, in which the gate G1 includes an aperture. In FIG. 8, an isolated vertical gate G1 (of the transistor TG1) separates the wells of the photosensitive region PD and the storage region S1, except in an area for charges to pass between the regions PD and S1, in which the gate G1 includes an aperture. An isolated vertical gate G2 (of the transistor TG2) separates the wells of the storage regions S1 and S2, except in an area for charges to pass between the regions S1 and S2, where the gate G2 includes an aperture. An isolated vertical gate GT2 (of the transistor T2) separates the well of the storage region S2 from the reading region RN, except in an area for charges to pass between the region S2 and the reading node, where the gate GT2 includes an aperture.

In FIG. 9, the storage regions S3 and S4 are surrounded by isolated vertical gates G3, G4 (of the transistors TG3, TG4) each having an aperture opening onto the well of the photosensitive region PD and enabling the transfer of charges from the region PD to the region S3 or S4. The storage regions S3 and S4 are also separated from the reading region RN by gates GT3, GT4, respectively (of the transistors T3, T4), each including an aperture for the transfer of charges to the reading region.

Likewise, the reading circuit including the transistors TR, T5 and T6 is surrounded by an isolating trench GR, for example having the shape of the isolated vertical gates described above. The upper faces of the gates GAB, G1 to G4, GT2 to GT4 are connected by metallization to nodes for application of the voltages VGAB, VG1 to VG4, VR, VR3 and VR4, respectively. The reading region RN is coupled to the reading circuit RDC by a metallization.

Moreover, the surface of the substrate above the storage regions S1 to S4 may be protected by a conductive layer forming a screen MS deposited on a dielectric layer DL to prevent electromagnetic radiation disturbing the quantity of electrical charges present in these regions.

It will be clear to the person skilled in the art that the above embodiments lend themselves to different variations and applications. In particular, the embodiments are not limited to a pixel circuit including two electrical charge storage areas between the photosensitive element and the reading node. Acquiring at least three images of the same scene with different integration times and combining the images acquired into a single image may be performed, for example.

Nor is it necessary for the duration of the first integration phase EXP1 to be greater than the duration of the second integration phase. The first integration phase may be used to acquire a first image providing details of light areas of a scene, while the second integration phase is used to acquire a second image providing details of dark areas of the first image.

The invention claimed is:

1. A method of acquiring an image using an image sensor comprising a pixel circuit having a photosensitive element, the method comprising:
   accumulating electrical charges from the photosensitive element of the pixel circuit during a first period;
   transferring the electrical charges accumulated during the first period to a first electrical charge storage region of the pixel circuit connected in series with a second electrical charge storage region of the pixel circuit;
   transferring the electrical charges from the first electrical charge storage region to the second electrical charge storage region of the pixel circuit and concurrently resetting the photosensitive element;
   accumulating electrical charges from the photosensitive element during a second period having a duration different from that of the first period;
   transferring the electrical charges accumulated during the second period to the first electrical charge storage region of the pixel circuit;
   successively transferring the electrical charges stored in the second and first storage regions to a common reading node of the pixel circuit separate from the first and second storage regions;
   acquiring a plurality of images from electrical charges transferred to the reading node from the first and second storage regions, respectively; and
   combining the acquired images into a resultant image.

2. The method of claim 1 wherein a first one of the acquired images includes details from dark areas of a second one of the acquired images, and wherein the second acquired image includes details of light areas of the first acquired image.

3. The method of claim 1 wherein acquiring the plurality of images comprises acquiring the plurality of images row of pixels by row of pixels by transferring to the reading node of each pixel circuit one of the rows of pixels, the charges stored in the second storage region, and then the charges stored in the first storage region.

4. The method of claim 1 wherein acquiring the plurality of images is triggered immediately at the end of the second period of accumulation of electrical charges.

5. The method of claim 1 wherein the first period of accumulating electrical charges is triggered after transferring is performed for a previous group of electrical charges accumulated during the second period to the first electrical charge storage region of the pixel circuit, and terminates after an interframe period beginning at the end of the image acquisition period of the preceding shot.

6. The method of claim 1 wherein one of the first and second periods of accumulating electrical charges has a duration equal to that of the other of the first and second periods of accumulating electrical charges multiplied by a power of 2.

7. The method of claim 1 wherein acquiring the plurality of images is triggered at the end of the second period of accumulation of electrical charges and concurrently with transferring of the electrical charges accumulated during the second period to the first electrical charge storage region of the pixel circuit.

8. A method of acquiring an image using an image sensor comprising a pixel circuit having a photosensitive element, the method comprising:
   accumulating electrical charges from the photosensitive element of the pixel circuit during a first period;
   transferring the electrical charges accumulated during the first period to a first electrical charge storage region of the pixel circuit connected in series with a second electrical charge storage region of the pixel circuit;
   transferring the electrical charges from the first electrical charge storage region to the second electrical charge storage region of the pixel circuit and concurrently resetting the photosensitive element;
   accumulating electrical charges from the photosensitive element during a second period;
   transferring the electrical charges accumulated during the second period to the first electrical charge storage region of the pixel circuit;
   transferring the electrical charges stored in the second and first storage regions to a common reading node of the pixel circuit separate from the first and second storage regions;
   acquiring a plurality of images from electrical charges transferred to the reading node from the first and second storage regions, respectively; and
   combining the acquired images into a resultant image.

9. The method of claim 8 wherein a first one of the acquired images includes details from dark areas of a second one of the acquired images, and wherein the second acquired image includes details of light areas of the first acquired image.

10. The method of claim 8 wherein acquiring the plurality of images comprises acquiring the plurality of images row of pixels by row of pixels by transferring to the reading node of each pixel circuit one of the rows of pixels, the charges stored in the second storage region, and then the charges stored in the second first region.

11. The method of claim 8 wherein acquiring the plurality of images is triggered immediately at the end of the second period of accumulation of electrical charges.

12. The method of claim 8 wherein the first period of accumulating electrical charges is triggered after transferring is performed for a previous group of electrical charges accumulated during the second period to the first electrical charge storage region of the pixel circuit, and terminates after an interframe period beginning at the end of the image acquisition period of the preceding shot.

13. The method of claim 8 wherein acquiring the plurality of images is triggered at the end of the second period of accumulation of electrical charges and concurrently with transferring of the electrical charges accumulated during the second period to the first electrical charge storage region of the pixel circuit.

14. An image acquisition device comprising:
   at least one pixel comprising
      a photosensitive element, first and second electrical charge storage regions connected in series, a reading node coupled to said first and second electrical charge storage regions, a first transistor coupled between the photosensitive element and the first storage region, a second transistor coupled between the second storage region and the reading node, and a reading circuit coupled to the reading node; and a control circuit cooperating with the at least one pixel to accumulate electrical charges from the photosensitive element of the at least one pixel circuit during a first period, transfer the electrical charges accumulated during the first period to the first electrical charge storage region, transfer the electrical charges from the first electrical charge storage region to the second electrical charge storage region of the pixel circuit and concurrently reset the photosensitive element, accumulate electrical charges from the photosensitive element during a second period having a duration different from that of the first period, transfer the electrical charges accumulated during the second period to the first electrical charge storage region of the pixel circuit, successively transfer the electrical charges stored in the second and first storage regions to the reading node of the pixel circuit separate from the first and second storage regions, acquire a plurality of images from electrical charges transferred to the reading node from the first and second storage regions, respectively, and combine the acquired images into a resultant image.

15. The image acquisition device of claim 14 further comprising a semiconductor substrate, and wherein each of the first and second storage regions comprise a respective doped region forming a well in the semiconductor substrate; and wherein the photosensitive element and the first and second transistors are also formed in the semiconductor substrate.

16. The image acquisition device of claim 15 further comprising at least one screen covering the wells in the semiconductor substrate.

17. The image acquisition device of claim 14 wherein the reading circuit comprises:

an amplifier transistor having a gate terminal connected to the reading node and supplying a voltage representative of the electrical charges present at the reading node; and a selector transistor connected to the amplifier transistor and supplying the voltage representative of the electrical charges present at the reading node at an output of the pixel circuit when the pixel circuit is selected for reading.

18. The image acquisition device of claim 14 wherein acquiring the plurality of images is triggered at the end of the second period of accumulation of electrical charges and concurrently with transferring of the electrical charges accumulated during the second period to the first electrical charge storage region of the pixel circuit.

* * * * *